US010958127B2

(12) United States Patent
Tramet et al.

(10) Patent No.: US 10,958,127 B2
(45) Date of Patent: Mar. 23, 2021

(54) CASING ELEMENT FOR AN ELECTRIC EQUIPMENT

(71) Applicant: Valeo Siemens eAutomotive France SAS, Cergy (FR)

(72) Inventors: Guillaume Tramet, Montesson (FR); Roger Deniot, Poissy (FR)

(73) Assignee: VALEO SIEMENS EAUTOMOTIVE FRANCE SAS, Cergy (FR)

( * ) Notice: Subject to any disclaimer, the term of this patent is extended or adjusted under 35 U.S.C. 154(b) by 0 days.

(21) Appl. No.: 16/226,806

(22) Filed: Dec. 20, 2018

(65) Prior Publication Data

US 2019/0199161 A1 Jun. 27, 2019

(30) Foreign Application Priority Data

Dec. 22, 2017 (FR) ...................................... 1762952

(51) Int. Cl.
| H01R 12/00 | (2006.01) |
| H02K 5/22 | (2006.01) |
| H01R 13/405 | (2006.01) |
| H02K 11/33 | (2016.01) |
| B60R 16/023 | (2006.01) |
| H05K 7/14 | (2006.01) |
| H05K 7/02 | (2006.01) |

(52) U.S. Cl.
CPC ......... *H02K 5/225* (2013.01); *B60R 16/0239* (2013.01); *H01R 13/405* (2013.01); *H02K 11/33* (2016.01); *H05K 7/1432* (2013.01); *H01R 2201/26* (2013.01); *H05K 7/026* (2013.01)

(58) Field of Classification Search
CPC . H01R 12/716; H01R 12/724; H01R 13/5213
USPC ............................ 439/76.1, 76.2, 733.1, 731
See application file for complete search history.

(56) References Cited

U.S. PATENT DOCUMENTS

| 4,850,884 A | 7/1989 | Sawai et al. |
| 7,134,910 B2* | 11/2006 | Nakano .................. H01R 4/028 439/570 |
| 8,408,922 B2* | 4/2013 | Yamamoto ............. H01R 13/41 439/78 |
| 2005/0167183 A1 | 8/2005 | Tominaga et al. |

(Continued)

FOREIGN PATENT DOCUMENTS

| DE | 37 40 568 A1 | 6/1988 |
| EP | 1 870 969 A1 | 12/2007 |

(Continued)

OTHER PUBLICATIONS

French Search Report for French Application No. 1762952 dated Aug. 28, 2018.

*Primary Examiner* — Phuong K Dinh
(74) *Attorney, Agent, or Firm* — McCormick, Paulding & Huber PLLC

(57) ABSTRACT

The invention relates to a casing element of an electric equipment, said casing element being configured to house at least one electrical conductor configured to form an external terminal of the electric equipment and at least one electronic power component, adapted to be electrically connected to said electrical conductor and to convert a direct current into an alternating current, said casing element being characterised in that it comprises reception members adapted to receive, by sliding, the electrical conductor.

19 Claims, 4 Drawing Sheets

(56) References Cited

U.S. PATENT DOCUMENTS

2012/0115340 A1    5/2012  Yamamoto
2016/0126808 A1    5/2016  Nagao et al.

FOREIGN PATENT DOCUMENTS

EP    3 176 919 A1    6/2017
FR     2963582 A1    2/2012

* cited by examiner

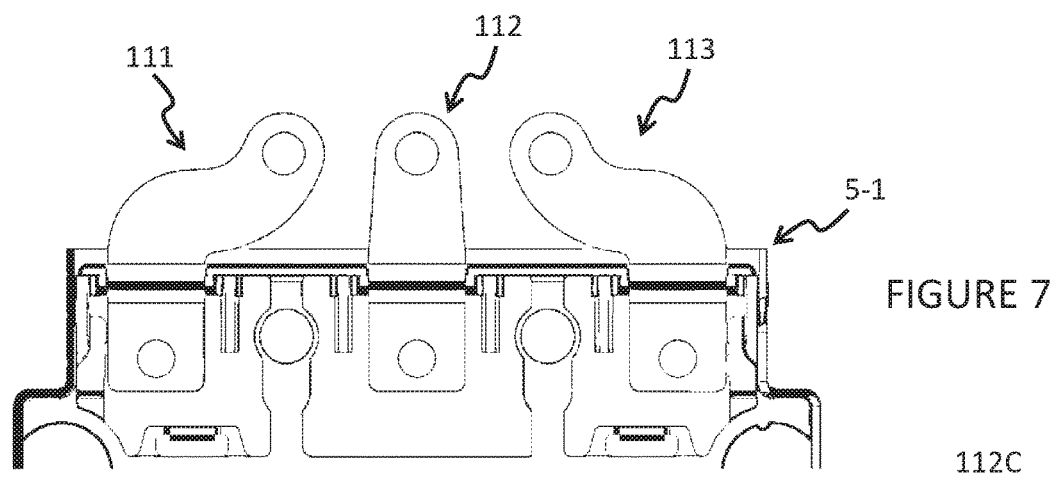
FIGURE 7
FIGURE 8
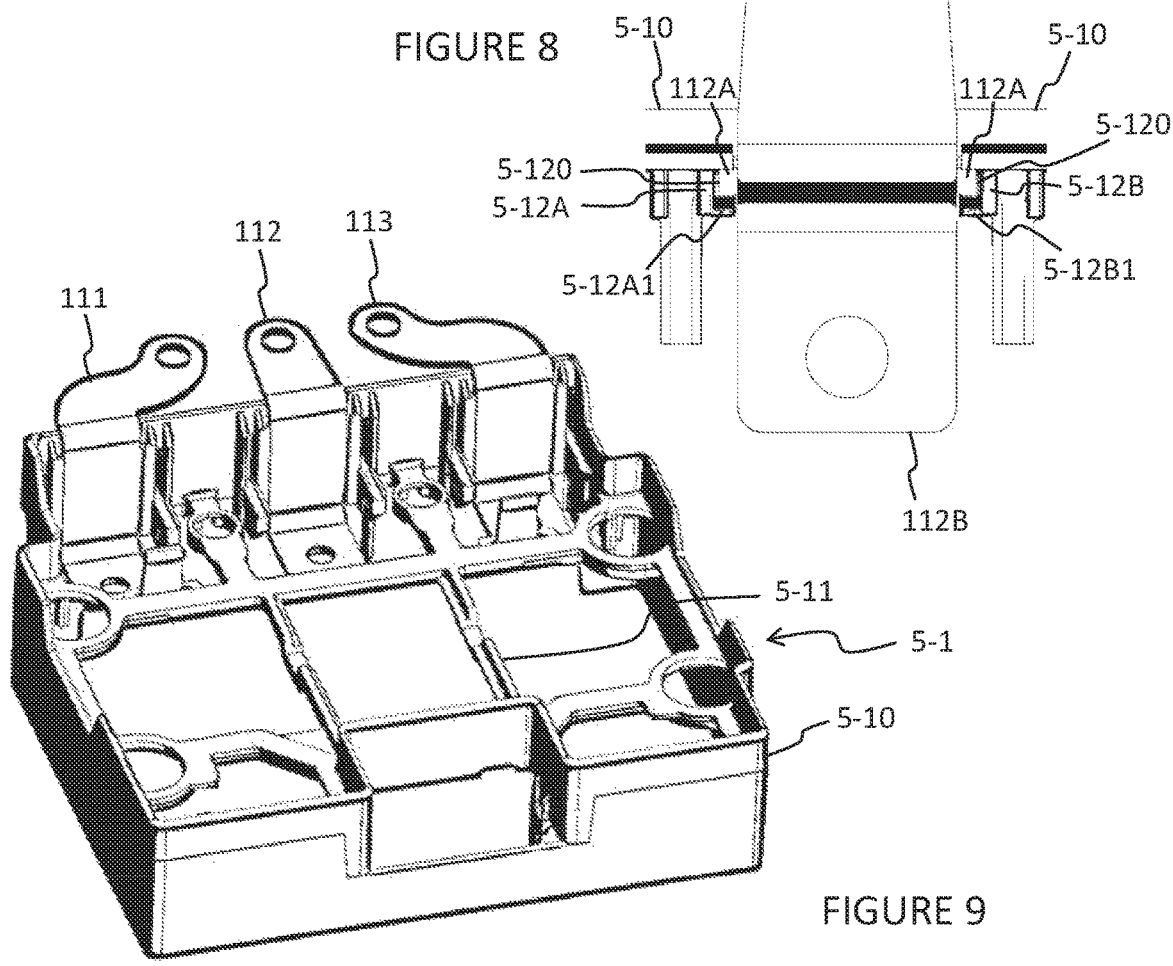
FIGURE 9

CASING ELEMENT FOR AN ELECTRIC EQUIPMENT

CROSS REFERENCE TO RELATED APPLICATION

This application claims foreign priority benefits under U.S.C. § 119 to French Patent Application No. 1762952 filed on Dec. 22, 2017, the content of which is hereby incorporated by reference in its entirety.

TECHNICAL FIELD

The present invention relates to an element of a casing for an electric equipment. The present invention relates more particularly to the field of high-voltage electric installations for electric and hybrid vehicles.

In particular, the purpose of the invention is to facilitate the assembly of electrical conductors on a casing element of an electric equipment, in particular for vehicles.

BACKGROUND

As is well known, an electric or hybrid automotive vehicle includes an electric drive system powered by a high-voltage battery through an on-board high-voltage electrical system and a plurality of auxiliary electrical installations, which are powered by a low-voltage battery through an on-board low-voltage electrical system. The high-voltage battery powers the electric drive system, thereby providing for the vehicle's propulsion. More specifically, in order to control the electric device driving the wheels of the vehicle, the use of an inverter enabling the conversion of the direct current provided by the high-voltage battery into one or several alternating control currents, for example sinusoidal currents, is known.

In a known solution, the inverter is in the form of a casing on which are mounted an electronic power module and an electronic control unit. The inverter comprises a body comprising the electric components through which the power driving the electric motor passes. The electronic control unit comprises electronic components enabling to control the electronic power module.

For the purpose of connecting the electronic power module to the high-voltage battery, the electronic power module comprises an electrical conductor called "positive potential" connected to the positive potential of the high-voltage battery, and an electrical conductor called "negative potential" connected to the negative potential of the high-voltage battery. Furthermore, in the case of a three-phase motor, the inverter comprises three electrical conductors, called "phase conductors", enabling to connect the electronic power module to the electric motor to control the motor by using three currents, called "phase currents", with a two-by-two phase change, for example of 120°, generated by the inverter from the direct current supplied by the high-voltage battery.

These phase conductors are in the form of strips that are cut and then folded, and made of an electrically-conducting material, for example copper. The dimensions, and in particular the thickness, of these phase conductors, depend on the intensity of the currents circulating through them. Therefore, when the inverter is used to control the electric device driving the wheels of the vehicle, relatively thick phase conductors must be used (for example with a thickness of more than 2 mm) to allow the circulation of high-intensity currents, for example of more than 100 A. However, when the inverter is used to store the energy produced by the electric device during a braking phase of the vehicle in the high-voltage battery, phase conductors with a reduced thickness can be used, for example with a thickness of less than 1 mm, as the intensity of the current circulating in the phase conductors in this case is lower, for example of less than 50 A.

According to a known solution, the phase conductors are first secured to the control module, by screwing onto the electronic control module so as to connect them electrically, and then overmoulded with an element of the inverter casing made of a plastic material. With this fixing method, the manufacturing of the inverter is expensive, complex and time-consuming, which is a disadvantage. Furthermore, this permanent fixing method does not enable to optimise the manufacturing of inverters based on the application for which they are intended, i.e. based on whether they are to be used to control the electric device or to store energy. In particular, it is not possible to change the type of electrical conductor depending on the intended applications when the conductors are overmoulded, which is another disadvantage.

There is therefore a need for a simple, reliable and efficient solution allowing to easily install and replace various types of phase conductors, in particular with different thicknesses.

SUMMARY

Therefore, the first object of the invention is a casing element of an electric equipment, in particular for a hybrid or electric vehicle, said casing element being configured to house at least one electrical conductor configured to form an external terminal of the electric equipment, and at least one electronic power component, adapted to be electrically connected to said electrical conductor, and in particular to convert a direct current into an alternating current, said casing element being notable in that it comprises reception members configured to house, by sliding, said electrical conductor.

The electrical conductor can be a metallic strip, preferably folded. The electrical conductor can comprise a first end configured to be electrically connected to an electronic power component and a second end configured to be electrically connected to a second electric equipment, for example an electric device such as a three-phase electric motor.

The reception members enable to achieve a connection of the sliding connection-type with the electrical conductor. This connection makes it very easy to install the conductor on the casing element. In particular, it is very easy for an operator to manually insert the electrical conductor in the reception members. The use of such reception members avoids having to overmould the electrical conductor in the material of the casing element, which on one hand facilitates and accelerates the manufacturing of the electric equipment and, on the other hand, facilitates maintenance operations as the electrical conductor can be easily removed or inserted in the casing element. Furthermore, the use of a sliding connection enables to install electrical conductors in a removable manner and with different thicknesses on the casing element, in particular depending on the intended application of the electric equipment and the intensity of the currents that are to circulate in the electrical conductor.

Preferably, the reception members comprise at least a pair of walls that extend in parallel to one another.

In one embodiment, the reception members comprise a plurality of pairs of walls, preferably three pairs of walls, to insert three electrical conductors enabling, in particular, to connect the electric equipment to a three-phase electric device.

In a preferred manner, the walls of the plurality of walls extend in parallel to one another.

According to one aspect of the invention, each pair of walls comprises a first wall and a second wall that extend in parallel to one another, the first wall comprising and edge that extends in the direction of the second wall, and the second wall comprising an edge that extends in the direction of the first wall, so as to guide the sliding of the phase conductor. For each pair of walls, the walls and their edges thereby allow to form two rails to guide and to support an electrical conductor.

Advantageously, the reception members comprise at least one stop end configured to define a stopping point for the sliding of the electrical conductor.

In another advantageous manner, the reception members are configured to allow the force-fitting of the electrical conductor. This force-fitting advantageously allows to firmly block the electrical conductor in the casing element. This force-fitting can be achieved by adapting the thickness of the guiding and support rails to the thickness of the electrical conductor, or by adding blocking portions to the reception members.

Advantageously, at least one of the first wall and of the second wall comprises a gadroon. The term "gadroon" is used to describe excess material thickness or a rib configured to adjust the fitting of the reception members and the phase conductors. The implementation of gadroons provides for an efficient blocking of the phase conductors following their force-fitting.

Advantageously, each of the first wall and of the second wall comprises at least one gadroon in order to make the blocking even more efficient.

In a preferred manner, the at least one gadroon is made from the material of the first wall or of the second wall to facilitate the manufacturing of the casing element.

According to one aspect of the invention, the casing element forms a side wall, preferably a single wall, of a casing, the reception members being located on said side wall.

Advantageously, the walls of the reception members extend from the side wall perpendicularly to said side wall and the edges extend in parallel to said side wall to ensure a robust blocking of the electrical conductor.

According to one aspect of the invention, the first wall and the second wall of each couple of walls extend on at least half of the height of the side wall, preferably on at least 80% of the height of the side wall, and more preferably still on at least 90% of the height of the side wall or on its entire height. This provides for an efficient blocking of each phase conductor between the first wall and the second wall.

In a preferred manner this belt features, at least partially, a "U" shape.

In a more preferred manner still, the reception members are made of the material of the side wall so as to facilitate the manufacturing of the casing element, namely by moulding.

More preferably still, the casing element is formed form a single block, which makes it robust, easy to handle during assembly operations, and easy to manufacture, in particular by moulding.

According to one aspect of the invention, the casing element is manufactured in a plastic material, which makes it light, robust and easy to manufacture, in particular by moulding. In particular, the casing element is made of an electrically-insulating material.

The invention also relates to an electric equipment, in particular for a hybrid or electric vehicle, comprising a casing as described above and at least one electrical conductor configured to form an external terminal of the electric equipment, said conductor comprising a strip mounted in said casing element by insertion in the reception members of the casing element.

Advantageously, the electric equipment comprises at least one electronic power component having at least one electric terminal and being mounted in said casing element, equipment wherein the electrical conductor comprises a central portion introduced in the reception members, from which extend a first end and a second end, the first end being secured to the electric terminal of the electronic power component to achieve an electric connection, the second end forming the external electric terminal of the electric equipment.

Advantageously, the electric equipment comprises a plurality of electrical conductors introduced in the respective reception members and a plurality of electronic power components forming an electronic power module, each electrical conductor connecting to a respective terminal of said electronic power module.

According to one aspect of the invention, the electronic power module is able to convert a direct current into a plurality of alternating currents called "phase currents", said plurality of phase currents circulating between the electronic power module and an electric device through the plurality of phase conductors. The terms "electronic power module able to convert a direct current into a plurality of alternating currents" is used to describe the fact that the electronic power module can be configured to convert a direct current into a plurality of alternating currents and/or to convert a plurality of alternating currents into a direct current.

In a preferred manner, the electronic module comprises a body.

According to one aspect of the invention, each electrical conductor is secured to the body by an electronic power module.

Advantageously, the body of the electronic power module comprises electric components through which the energy powering the electric motor travels.

Preferably, the electric equipment is an inverter configured to be electrically connected to an electric device or to a high-voltage battery through the electrical conductor.

According to another aspect of the invention, the electric equipment comprises an electronic control unit of said electronic power module, coupled to said electronic power module.

Advantageously, the electronic control unit comprises electronic components enabling to control said electronic power module.

The invention also relates to an electric or hybrid vehicle comprising an electric device, for example a motorisation device, powered by a high-voltage battery through a high-voltage electrical system on-board the vehicle and an electric equipment, such as described above, connected to said electric device.

BRIEF DESCRIPTION OF THE DRAWINGS

The invention will be better understood upon reading the following description, provided solely as an example, and with reference to the appended drawings, provided as examples and not limited thereto, wherein identical references are made to similar items and wherein:

FIG. 7 is a top view of the casing element of FIG. 5 on which are mounted the phase conductors of FIG. 3, FIG. 8 is a partial perspective and close-up view of the casing element of the inverter of FIG. 7, and FIG. 9 is a perspective view of the casing element of FIG. 5 on which are mounted the phase conductors of FIG. 3.

Figure 1:
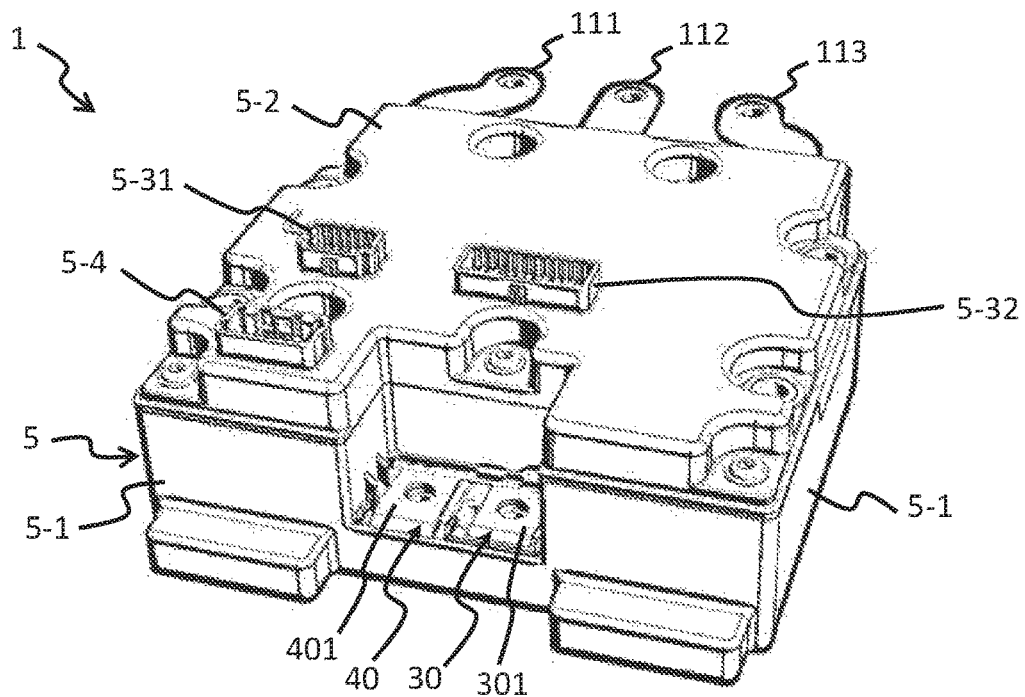
FIG. 1 is a perspective view of an embodiment of an inverter according to the invention.

It should be noted that the figures provide a detailed view of the invention to illustrate its implementation, said figures can naturally also serve to better define the invention as necessary.

DETAILED DESCRIPTION

In the detailed description provided below, the invention is described in its application to an electric or hybrid automotive vehicle, without it being limiting in terms of the scope of the present invention.

In the example described below, the vehicle comprises in particular an electric device, an electric equipment in to form of an inverter, a high-voltage battery, an on-board high voltage electrical system, a low-voltage battery, a low-voltage electrical system and a plurality of auxiliary electrical installations.

The electric equipment according to the invention is described below in its implementation for an inverter, without it limiting the scope of the present invention. It should therefore be noted that the electric equipment can be other than an inverter, for example a charger or a DCDC converter on board the vehicle The on-board low-voltage electrical system connects the low-voltage battery to the plurality of auxiliary electrical installations so that the low-voltage battery powers said auxiliary electrical installations, such as on-board computers, the window lift motors, the multimedia system etc. The low-voltage battery typically delivers a voltage of around 12 V, 24 V or 48 V. The charging of the low-voltage battery is conducted from the high-voltage battery through a direct voltage to direct voltage converter, commonly known as a direct-to-direct converter.

The on-board high-voltage electrical system connects the high-voltage battery to the inverter so that the high-voltage battery powers the electric device through the inverter. The high-voltage battery typically supplies a voltage ranging from 100 V to 900 V, preferably from 100 V to 500 V. The electrical power charging of the high-voltage battery is achieved by connecting the battery, through the high-voltage electrical system of the vehicle, to an external electricity grid, for example the domestic alternating electricity grid.

The electric device is a rotating electric device, preferably provided to drive the wheels of the vehicle using the power supplied by the high-voltage battery. More specifically, the electric device is an alternating current electric device powered by a source of multiphase current. For example, the electric device can be an alternating current motor. In the preferred example described below, the electric device is powered by a source of three-phase currents, without this being limiting in terms of the scope of the present invention.

In this example, the control of the electric device is achieved by means of an inverter. Said inverter converts the direct current supplied by the high-voltage battery into three alternating control currents, for example sinusoidal currents. In other words, the purpose of the inverter is to transform the incoming direct current delivered by the high-voltage battery into three phase currents that enable to control the electric device. Inversely, in another operating mode, the electric device can also supply three alternating currents to the inverter so that said inverter transforms them into a direct current that can be used to charge the high-voltage battery.

Figure 2:
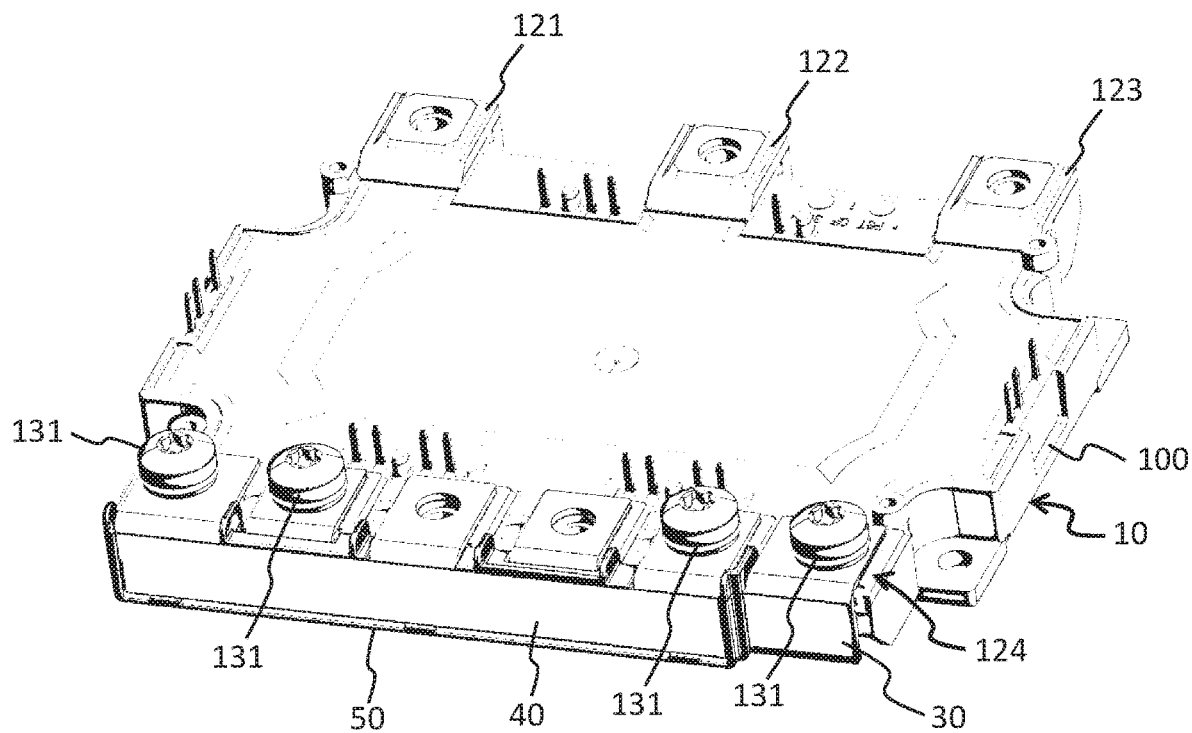
FIG. 2 is a partial perspective view of the unit formed by the electronic module, the first positive potential electrical conductor, and the first negative potential electrical conductor, and the fixation bar of the inverter of FIG. 1.

In the example shown in FIG. 1, the inverter 1 comprises a casing 5 in which are mounted, with reference to FIG. 2, an electronic power module 10, an electronic control unit (not shown for purposes of clarity) and a plurality of electrical conductors 30, 40, 111, 112, 113. The electronic control unit comprises components enabling to control the components of the electronic power module 10. More specifically, the electronic control unit controls the electronic power unit 10 so that it converts the direct current supplied by the high-voltage battery, defining a direct voltage from the first electrical conductor 30 and the second electrical conductor 40, into three alternating phase currents to control the motor (or inversely).

Figure 3:
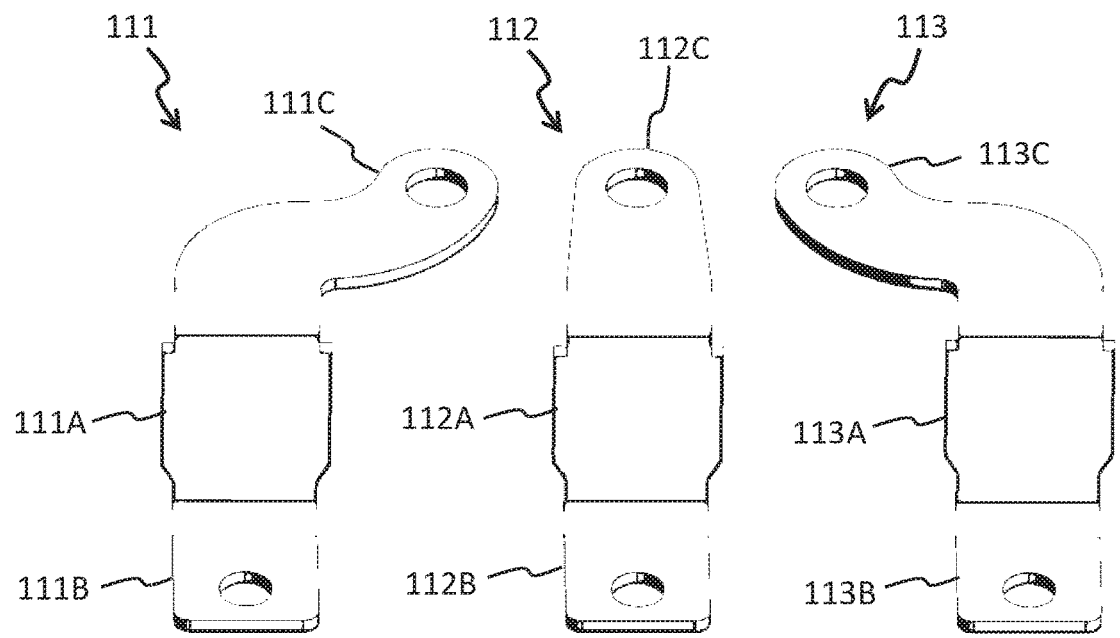
FIG. 3 is a perspective view of a set of phase conductors.

With reference to FIGS. 1 to 3, the electronic power module 10 comprises a body 100 on which are secured the electrical conductors 30, 40, 111, 112, 113. Furthermore, the electronic power module 10 comprises electronic power components 30 through which the electric energy passes to power the electric device, in particular configured to convert the direct current to alternating currents or inversely. These electronic power components can comprise electronic switches, such as, for example, semiconductor transistors, arranged in an electric circuit to enable a controlled passage of the electric power from the high-voltage battery to the electric device. In particular, the electronic power components are bare semiconductor chips for which the body 100 provides an encapsulation. With reference to FIG. 2, the electronic power module 10 comprises nine external electric terminals, forming in particular, on one hand, three phase ports 121, 122, 123 each delivering a motor control phase current and, on the other hand, three external positive electric terminals 124 (only one of which is shown in FIG. 2) and three external negative electric terminals (not shown).

In the example shown in FIGS. 1 to 3, the inverter 1 comprises a first electrical conductor 30 configured to electrically connect the inverter 1 to the positive potential of the high-voltage battery (not shown), a second electrical conductor 40 configured to connect electrically the inverter 1 to the negative potential of the high-voltage battery and three "phase" conductors 111, 112, 113 provided to electrically connect the inverter 1 to the electric device.

With reference to FIG. 2, each electrical conductor 30, 40 is in the form of a strip on which extend three fixation elements 301, 401. The two fixation elements 301, 401 located at the ends of each electrical conductor 30, 40 enable to fix said electric conductor 30, 40 to the corresponding external electric terminals, respectively positive 124 and negative, of the electronic power module 10 using a screw 131. The orifices 301A, 401A of the central fixation elements 301, 401 respectively of the first electrical conductor 30 and of the second electrical conductor 40 are left free to enable, at a later stage, the connection of the positive and negative terminals of the high-voltage battery. As shown in FIG. 2, the inverter 1 further comprises an electrically-insulating fixation bar 50 separating the first electrical conductor 30 from the second electrical conductor 40, in particular to prevent short-circuits between the first electrical conductor 30 and the second electrical conductor 40. For this purpose, the fixation bar 50 is preferably made of a plastic material, such as, for example, PBT GF30.

Each phase conductor 111, 112, 113 enables the electrical connection of a phase of the electric device controlled by the inverter 1 to the electronic power module 10. It should be noted, in another embodiment, that the inverter 1 could comprise a different amount of phase conductors 111, 112, 113, in particular an amount based on the number of phases of the electric device controlled by the inverter 1.

Each phase connector 111, 112, 113 is mounted on the corresponding phase port 121, 122, 123 by a fixation means, for example a screw (not shown). Each phase conductor 111, 112, 113 passes through an opening of the casing 5 to connect the inverter 1 to the electric device, and in particular to allow the circulation of alternating currents between the electronic power module 10 and the electric device.

With reference now to FIGS. 3 to 6, each phase conductor 111, 112, 113 is in the form of a single-block part, i.e. made of a single part. This part is in the form of a strip formed in an electrically-conducting material. In this preferred example, the phase conductor 111, 112, 113 is made of an electrically-conducting material, for example copper, steel or aluminium.

The thickness of the phase conductors 111, 112, 113 can be chosen based on their required use and, in particular, on the intensity of the currents that travel through them. Advantageously, the thickness of the phase conductors 111, 112, 113 ranges from 0.5 to 3 mm. Preferably, the thickness of the phase conductors 111, 112, 113 is of around 1 mm, 1.5 mm or 2 mm. The phase conductors 111, 112, 113 can also, advantageously, be treated with an anti-wear surface coating, for example made of tin and/or nickel for the compatibility of the materials or to improve the electric current.

In the example shown in the figures, each electrical conductor 111, 112, 113 comprises a central portion 111A, 112A, 113A from which extend perpendicularly but in the opposite direction a first fixation end 111B, 112B, 113B, and a second fixation end 111C, 112C, 113C. The first fixation end 111B, 112B, 113B is configured to be connected to a port phase 121, 122, 123 of the electronic power module 10, for example by means of a screw. For this purpose, the first fixation end 111B, 112B, 113B is in the form of a flat portion adapted to come into contact with a flat portion of a phase port 121, 122, 123. The second fixation end 111C, 112C, 113C is configured to be connected to a phase conductor (not shown) of the electric device. For this purpose, the second fixation end 111C, 112C, 113C is in the form of a flat portion adapted to come into contact with a flat portion of a phase conductor of the electric device.

It should be noted that in this non-limiting example, the second ends 111C, 113C of the phase conductors 111 and 113 are configured to come closer to the second end 112C of the phase conductor 112 positioned centrally, which is located in the extension of the central portion 112A of said central phase conductor 112. This results in bringing the second ends 111C, 112C, 113C of the phase conductors 111, 112, 113 closer, so that they can be connected with the corresponding phase conductors, arranged in a similar fashion, of the electric device. However, the second ends 111C, 112C, 113C can be formed differently, depending in particular on the environment in which the inverter 1 is to be mounted.

As shown in FIG. 1, the casing 5 comprises a casing element 5-1 and a cover 5-2, mounted on the element of the casing 5. The casing 5 also comprises a bottom (not visible in FIG. 1) that extends under the casing element 5-1. In the example shown in FIG. 1, the inverter 1 further comprises, in a non-limiting manner, two signal connectors 5-31, 5-32, described above, and a power connector 5-4 mounted on the cover 5-2 of the casing 5. The signal connectors 5-31, 5-32 are configured to enable an exchange of data signals between the components of the inverter 1 and the exterior of the inverter 1, for example with a controller of the vehicle. In particular, these signal connectors 5-31, 5-32 can be connected to an electronic control unit (not shown) mounted in the casing element 5-1. The power connector 5-4 is configured to connect the inverter 1 to an electric power cable, for example connected to the on-board low-voltage electric network, so as to enable the electric powering of said electronic control unit.

Figure 4:
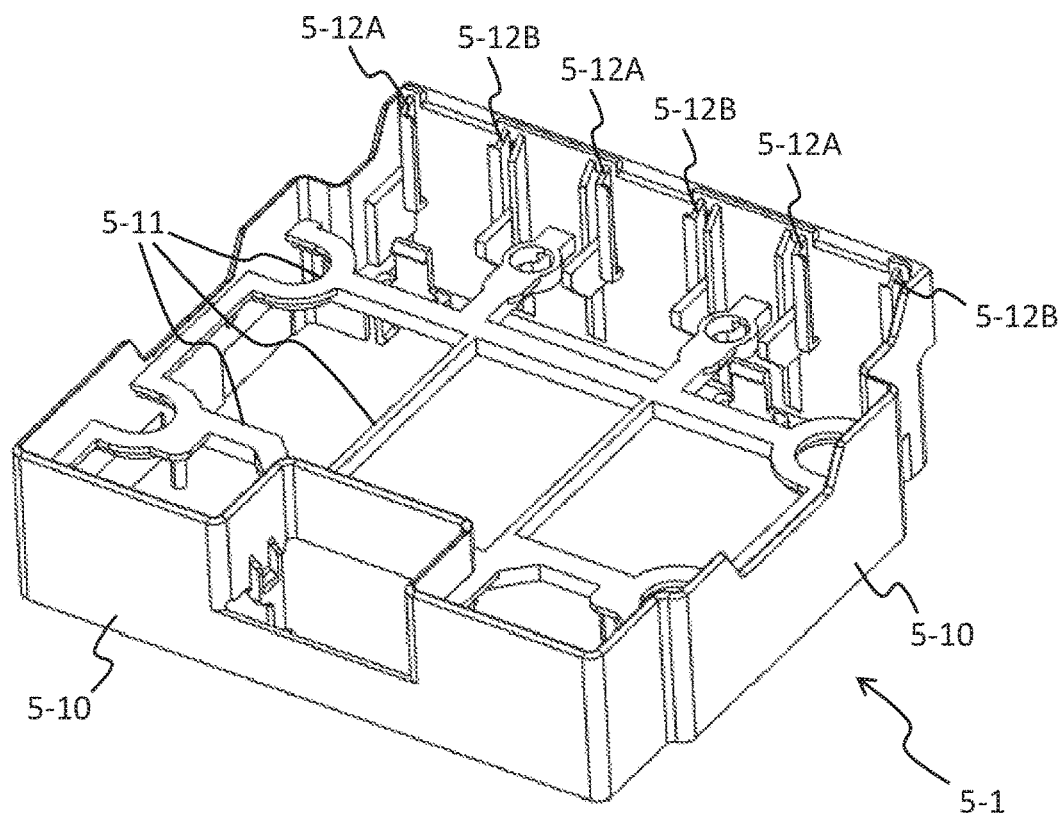
FIG. 4 is a perspective view of the casing element of the inverter of FIG. 1.
Figure 5:
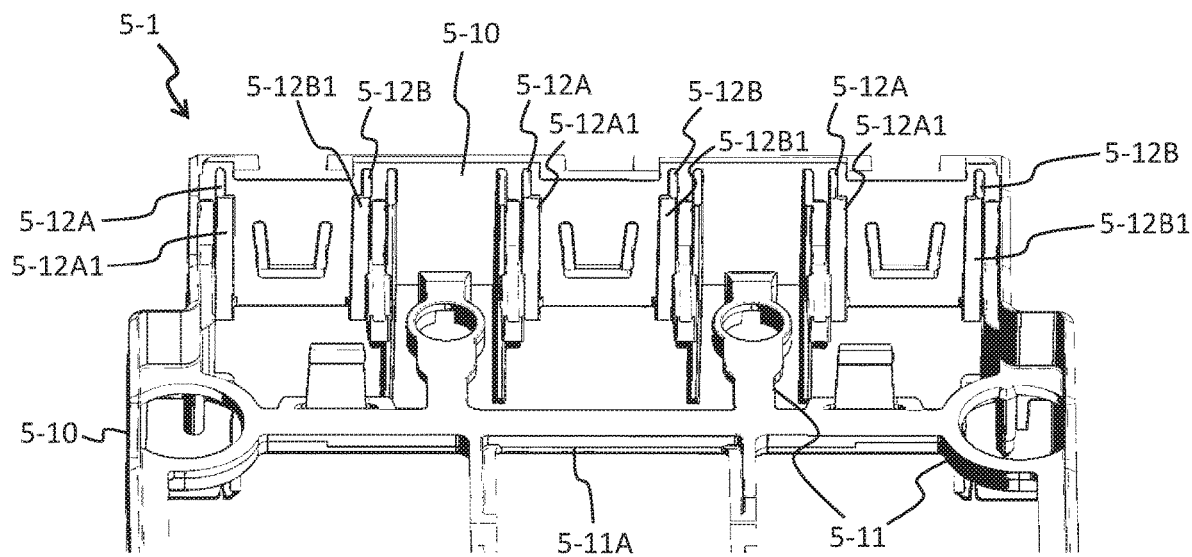
FIG. 5 is a partial perspective and close-up view of the casing element of FIG. 4 showing the reception members and the phase conductors of FIG. 3.
Figure 6:
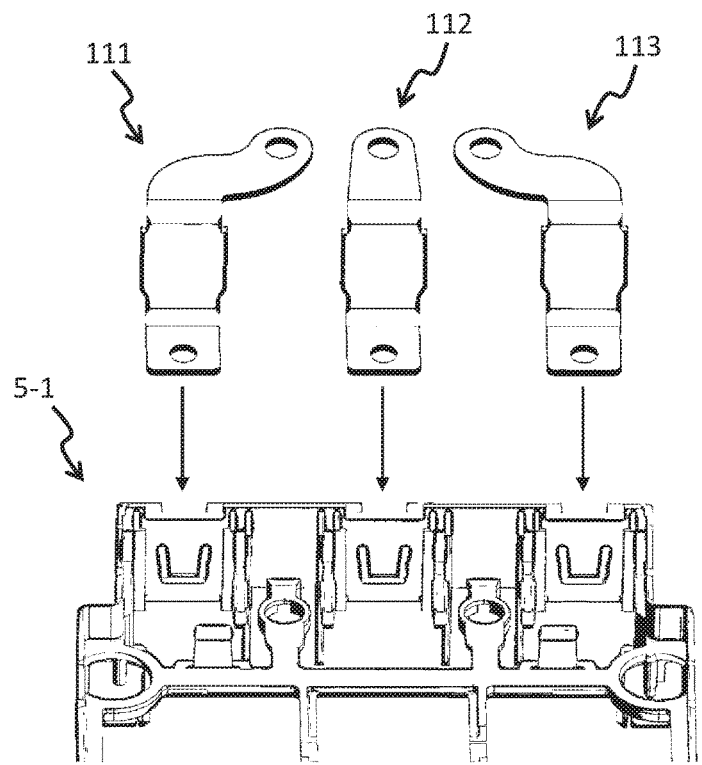
FIG. 6 is a perspective view of the set of phase conductors of FIG. 3 on the casing element of FIG. 5.

With reference now to FIG. 4, the casing element 5-1 is in the form of a single block made by moulding a plastic material that is electrically-insulating. The casing element 5-1 comprises a side wall 5-10 in the form of a U-shaped belt and support elements 5-11 configured to support the electronic power module 10 and the electronic control unit. In this example, the support elements 5-11 in particular comprise stringers 5-11A enabling to house the body 100 of the electronic power module 10 and the electronic control unit.

With reference to the FIGS. 5 to 9, the casing element 5 comprises reception members enabling to immobilise, in this example by force-fitting, the phase conductors 111, 112, 113. These reception members are formed from the material of the side wall 5-10 and comprise three pairs of rails, each adapted to house a phase conductor 111, 112, 113.

More specifically, each pair of rails comprises a first wall 5-12A, and a second wall 5-12B that extend parallel to one another and perpendicular to the side wall 5-10 so as to immobilise a phase conductor 111, 112, 113. In this example, the first wall 5-12A and the second wall 5-12B of each pair of walls 5-12A, 5-12B extend substantially over the entire height of the side wall 5-10.

Preferably, each one of the first wall 5-12A and of the second wall 5-12B of each pair of walls 5-12A, 5-12B comprises at least one gadroon 5-120. This gadroon 5-120 forms an excess material thickness to help adjust the insertion between each pair of walls 5-12A, 5-12B and the corresponding phase conductor 111, 112, 113 so as to immobilise them efficiently one in the other. In this example, the gadroons 5-120 are formed from the material of the first wall 5-12A and of the second wall 5-12B of each pair of walls 5-12A, 5-12B.

Still in the shown example, the first wall 5-12A comprises an edge 5-12A1, that extends in parallel to the side wall 5-10 in the direction of the second wall 5-12B, and the second wall 5-12B also comprises an edge 5-12B1, that extends in parallel to the side wall 5-10 in the direction of the first wall 5-12A.

During the assembly of the inverter, the electronic power module 10 and the electronic control unit are assembled first. Each phase conductor 111, 112, 113 is then force-fitted by sliding between each pair of walls 5-12A, 5-12B so as to be blocked by the gadroons of the first wall 5-12A and of the second wall 5-12B of each pair of walls 5-12A, 5-12B.

Then, each phase conductor 111, 112, 113 is screwed to the corresponding phase port 121, 122, 123 so as to connect it electrically to the phase ports 121, 122, 123 of the electronic power module 10.

The edges 5-12A1, 5-12B1 of each pair of walls 5-12A, 5-12B further enable to maintain the phase conductors 111, 112, 113 between the first wall 5-12A and the second wall 5-12B.

The cover 5-2 and the bottom of the casing 5 can then be secured to the casing element 5-1 so as to close the casing and, for example, to seal the inverter 1. The phase conductors 111, 112, 113 of the inverter 1 can then be electrically connected to the electric device and the positive and negative potential electrical conductors 30, 40 can be connected to the high-voltage battery of the vehicle.

The invention is not limited to the example described above. The figures show a specific embodiment example that combines several embodiments. However, the features of each embodiment can be independent from one another in various modes, or they can be combined, as shown in the claims.

What is claimed is:

1. A casing element of an electric equipment, said casing element comprising at least one electrical conductor housed in said casing element configured to form an external terminal of the electric equipment and at least one electronic power component, adapted to be electrically connected to said electrical conductor, wherein reception members are adapted to receive, by sliding, the electrical conductor and wherein the reception members are configured for the force-fitting of the electrical conductor, said casing element being characterized in that blocking portions are added to the reception members.

2. A casing element according to claim 1, wherein the reception members comprise at least one pair of walls extending parallel to one another.

3. A casing element according to claim 2, wherein the pair of walls comprises a first wall and a second wall that extend in parallel to one another, the first wall comprising an edge extending in the direction of the second wall, the second wall comprising an edge extending in the direction of the first wall so as to guide the sliding of the phase conductor.

4. A casing element according to claim 1, wherein the reception members comprise at least one stop end configured to stop the sliding of the electrical conductor.

5. A casing element according to claim 3, wherein said casing element forms a side wall of a casing, the reception members being located on said side wall.

6. A casing element according to claim 5, wherein the walls extend from the side wall perpendicularly to said side wall and the edges extend in parallel to said side wall.

7. A casing element according to claim 6, wherein the first wall and the second wall extend on at least half the height of the side wall.

8. Electric equipment, comprising a casing element and at least one electrical conductor configured to form an external terminal of the electric equipment, said casing element being configured to house the at least one electrical conductor and at least one electronic power component, adapted to be electrically connected to said electrical conductor, wherein reception members are adapted to receive, by sliding, the electrical conductor and wherein the reception members are configured for the force-fitting of the electrical conductor, said casing element being characterized in that blocking portions are added to the reception members, said electrical conductor comprising a strip mounted in said casing element by insertion in the reception members of the casing element.

9. The electric equipment according to claim 8, comprising at least one electronic power component having at least one electric terminal and being mounted in said casing element, equipment wherein the electrical conductor comprises a central portion introduced in the reception members, from which extend a first end and a second end, the first end being secured to the electric terminal of the electronic power component to achieve an electric connection, the second end forming the external electric terminal of the electric equipment.

10. The electric equipment according to claim 8, comprising a plurality of electrical conductors introduced in the respective reception members and a plurality of electronic power components forming an electronic power module, each electrical conductor connecting to a respective terminal of said electronic power module.

11. The electric equipment according to claim 8, said electric equipment being an inverter provided to be electrically-connected to an electric device through the electrical conductor.

12. A casing element according to claim 2, wherein the reception members comprise at least one stop end configured to stop the sliding of the electrical conductor.

13. A casing element according to claim 3, wherein the reception members comprise at least one stop end configured to stop the sliding of the electrical conductor.

14. A casing element according to claim 1, wherein said casing element forms a side wall of a casing, the reception members being located on said side wall.

15. A casing element according to claim 2, wherein said casing element forms a side wall of a casing, the reception members being located on said side wall.

16. A casing element according to claim 4, wherein said casing element forms a side wall of a casing, the reception members being located on said side wall.

17. The electric equipment according to claim 9, comprising a plurality of electrical conductors introduced in the respective reception members and a plurality of electronic power components forming an electronic power module, each electrical conductor connecting to a respective terminal of said electronic power module.

18. The electric equipment according to claim 9, said electric equipment being an inverter provided to be electrically-connected to an electric device through the electrical conductor.

19. The electric equipment according to claim 10, said electric equipment being an inverter provided to be electrically-connected to an electric device through the electrical conductor.

* * * * *